US008525523B2

(12) United States Patent
Kerl et al.

(10) Patent No.: US 8,525,523 B2
(45) Date of Patent: Sep. 3, 2013

(54) PARTIAL DISCHARGE ANALYSIS COUPLING DEVICE THAT GENERATES A PULSE SIGNAL AND A REFERENCE SIGNAL

(75) Inventors: James Edward Kerl, Fairfield, OH (US); Karim Younsi, Ballston Lake, NY (US); Yingneng Zhou, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 322 days.

(21) Appl. No.: 13/099,610

(22) Filed: May 3, 2011

(65) Prior Publication Data

US 2012/0280699 A1    Nov. 8, 2012

(51) Int. Cl.
*G01R 31/08* (2006.01)
*G01R 31/12* (2006.01)

(52) U.S. Cl.
USPC ......................................................... 324/536

(58) Field of Classification Search
None
See application file for complete search history.

(56) References Cited

U.S. PATENT DOCUMENTS

| 5,991,137 A | 11/1999 | Krahn et al. |
| 6,407,903 B1 | 6/2002 | Krahn et al. |
| 7,285,960 B2 | 10/2007 | Koch et al. |
| 7,579,843 B2 | 8/2009 | Younsi et al. |
| 2008/0088314 A1* | 4/2008 | Younsi et al. .................. 324/457 |
| 2009/0189594 A1* | 7/2009 | Cern ........................... 324/76.19 |
| 2010/0013494 A1 | 1/2010 | Twerdochlib |
| 2010/0073008 A1 | 3/2010 | Twerdochlib |

FOREIGN PATENT DOCUMENTS

| WO | 98/16841 A1 | 4/1998 |
| WO | 2010036469 A2 | 4/2010 |

OTHER PUBLICATIONS

Search Report issued in connection with GB Application No. 1207523.0, Aug. 10, 2012.

* cited by examiner

*Primary Examiner* — Vinh Nguyen
(74) *Attorney, Agent, or Firm* — Ernest G. Cusick; Hoffman Warnick LLC

(57) ABSTRACT

A partial discharge analysis (PDA) coupling device is provided. In one embodiment, a device includes: a connector electrically connecting a first coupling capacitor and a second coupling capacitor; a first conductive rod for electrically connecting the first coupling capacitor to a high voltage input; a second conductive rod for electrically connecting the second coupling capacitor to ground; a current transformer substantially surrounding a portion of the second conductive rod, the current transformer configured to generate a pulse signal; and a reference signal generator adjacent to the current transformer configured to generate a reference signal in phase with the pulse signal.

20 Claims, 5 Drawing Sheets

PARTIAL DISCHARGE ANALYSIS COUPLING DEVICE THAT GENERATES A PULSE SIGNAL AND A REFERENCE SIGNAL

BACKGROUND OF THE INVENTION

The subject matter disclosed herein relates generally to electrical coupling devices. More specifically, the present disclosure relates to partial discharge analysis (PDA) coupling devices that generate a pulse signal and a reference signal.

A partial discharge analyzer is an instrument that is used to measure partial discharge on rotating machines, such as motors and generator stator systems. In one example, the partial discharge analyzer is used to monitor the degradation of the insulation within the generator stator windings.

A PDA coupling device is electrically connected to the machine being monitored by the partial discharge analyzer and the partial discharge analyzer. For example, one end of the PDA coupling device (i.e., the high voltage side) may be connected to the leads of the generator stator windings and the opposite end of the PDA coupling device may be connected to ground. The PDA coupling device generates a pulse signal that is received by the partial discharge analyzer. The partial discharge analyzer analyzes the pulse signal to determine, for example, the degradation of the generator stator windings insulation. In order to perform the analysis of the pulse signal, the partial discharge analyzer utilizes a reference signal. This reference signal is conventionally received from another device connected to the partial discharge analyzer. However, the reference signal is usually not "in phase" with the pulse signal, which makes it difficult for the partial discharge analyzer to analyze the pulse signal. As known in the art, to be "in phase", two signals must go through the maximum and minimum points at the same time and in the same direction.

BRIEF DESCRIPTION OF THE INVENTION

Aspects of the invention provide for a partial discharge analysis (PDA) coupling device. In one embodiment, aspects of the invention include a device comprising: a connector electrically connecting a first coupling capacitor and a second coupling capacitor; a first conductive rod for electrically connecting the first coupling capacitor to a high voltage input; a second conductive rod for electrically connecting the second coupling capacitor to ground; a current transformer substantially surrounding a portion of the second conductive rod, the current transformer configured to generate a pulse signal; and a reference signal generator adjacent to the current transformer configured to generate a reference signal in phase with the pulse signal.

A first aspect of the invention provides a device comprising: a connector electrically connecting a first coupling capacitor and a second coupling capacitor; a first conductive rod for electrically connecting the first coupling capacitor to a high voltage input; a second conductive rod for electrically connecting the second coupling capacitor to ground; a current transformer substantially surrounding a portion of the second conductive rod, the current transformer configured to generate a pulse signal; and a reference signal generator adjacent to the current transformer configured to generate a reference signal in phase with the pulse signal.

A second aspect of the invention provides a partial discharge analysis (PDA) coupling device comprising: a connector electrically connecting a first coupling capacitor and a second coupling capacitor; a first conductive rod configured to electrically connect the first coupling capacitor to a high voltage output of a generator; a second conductive rod configured to electrically connect the second coupling capacitor to ground; a current transformer substantially surrounding a portion of the second conductive rod, the current transformer configured to generate a pulse signal; a reference signal generator adjacent to the current transformer configured to generate a reference signal in phase with the pulse signal; and a casing comprising a cavity including electrical potting material, wherein the cavity includes at least the connector, the first and second coupling capacitors, the first and second conductive rods, and the current transformer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
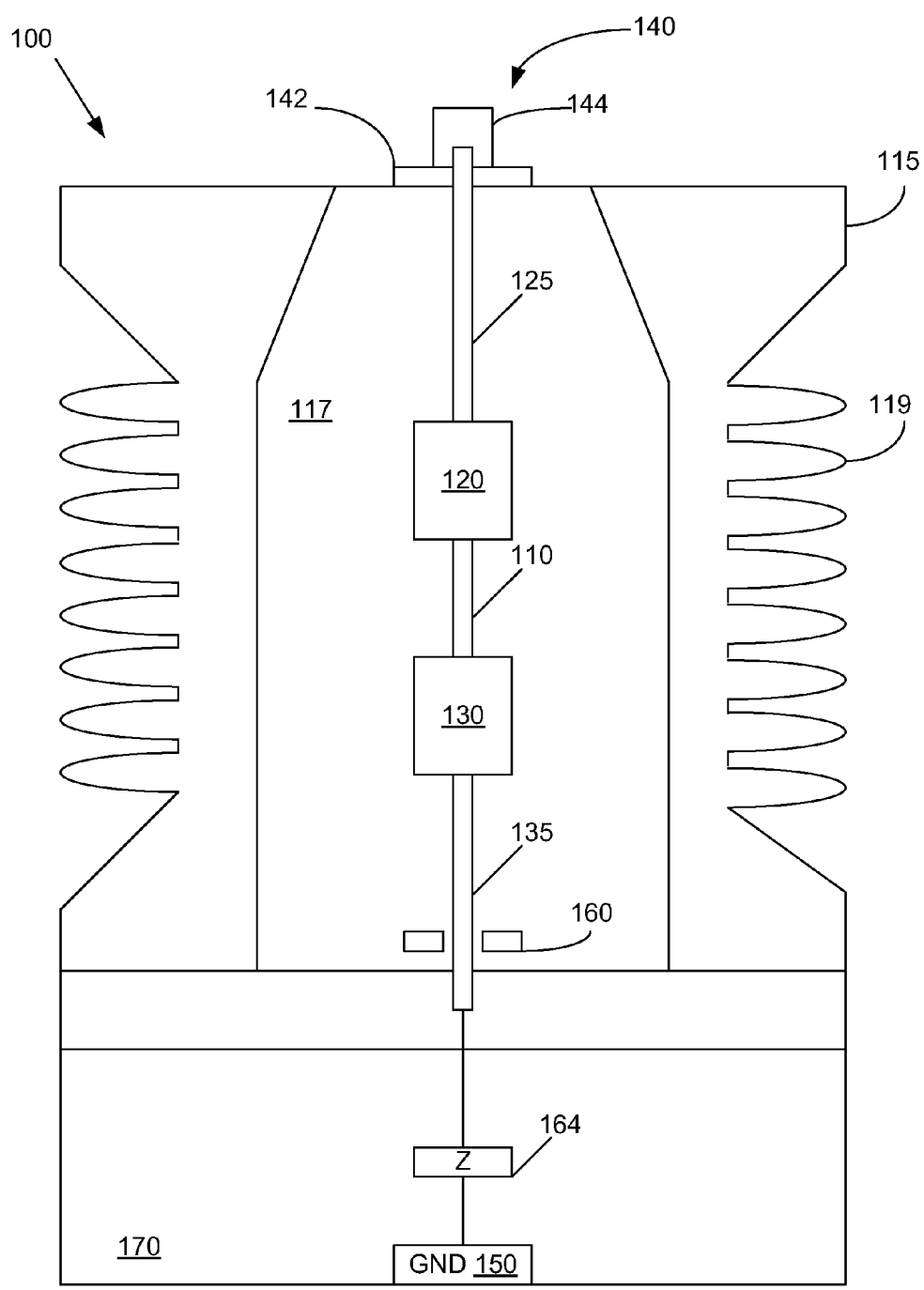
FIG. 1 shows a cross-sectional view of a PDA coupling device according to an embodiment of the invention.

Turning to FIG. 1, a cross-sectional view of a partial discharge analysis (PDA) coupling device 100 according to an embodiment of the invention is shown. PDA coupling device 100 includes a casing 115 comprising a cavity 117. Casing 115 may include any now known or later developed insulating material, such as, but not limited to aluminum trihydrate, polycarbonate, or epoxy, such as glass-filled cycloaliphatic epoxy. Cavity 117 may be filled with an electrical potting material (not shown). The electrical potting material may be any now known or later developed encapsulating material, such as, but not limited to, filled or unfilled polyurethane, silicone, epoxy, a mixture of mica and epoxy, polyester, ethylene propylene rubber (EPR), or fluorocarbon or perfluorocarbon.

Casing 115 may be substantially cylindrical in shape and include a plurality of ribs 119 on its outer surface. However, it is understood that casing 115 may be any other desired shape. Further, although cavity 117 is shown including a conical shape at the top portion, it is understood that cavity 117 may be any other desired shape.

As seen in FIG. 1, within cavity 117, the electrical potting material encapsulates a connector 110, a first coupling capacitor 120, a second coupling capacitor 130, a first conductive rod 125, and a second conductive rod 135. Connector 110 electrically connects first coupling capacitor 120 and second coupling capacitor 130. Although only two coupling capacitors 120, 130 are shown, it is understood that PDA coupling device 100 may include one or more coupling capacitors, as required. First and second coupling capacitors 120, 130 are located along a central axis within casing 115, so that a uniform electrical stress is provided.

First coupling capacitor 120 is electrically connected to a high voltage input end 140 of PDA coupling device 100 by a first conductive rod 125. First conductive rod 125 may be secured to casing 115 using any known fashion. For example, as shown in FIG. 1, first conductive rod 125 may be secured to casing 115 with an optional washer 142 and a nut 144. Nut 144 may be used to electrically contact high voltage input end 140 of PDA coupling device 100 to a high voltage output of the stator windings in a generator (not shown). For example, the high voltage output of the stator windings in a generator (not shown) may be approximately 13,800 volts.

Second coupling capacitor 130 is electrically connected to ground 150 by second conductive rod 135. A current transformer 160 substantially surrounds a portion of second conductive rod 135. Current transformer 160 is configured to generate a pulse signal (not shown) that indicates, for example, the degradation of the generator stator windings insulation (not shown). A reference signal generator 164 is positioned adjacent to current transformer 160 and is configured to generate a reference signal (not shown). As will be described in more detail below, the pulse signal generated by current transformer 160 and the reference signal generated by reference signal generator 164 are in phase.

Figure 2:
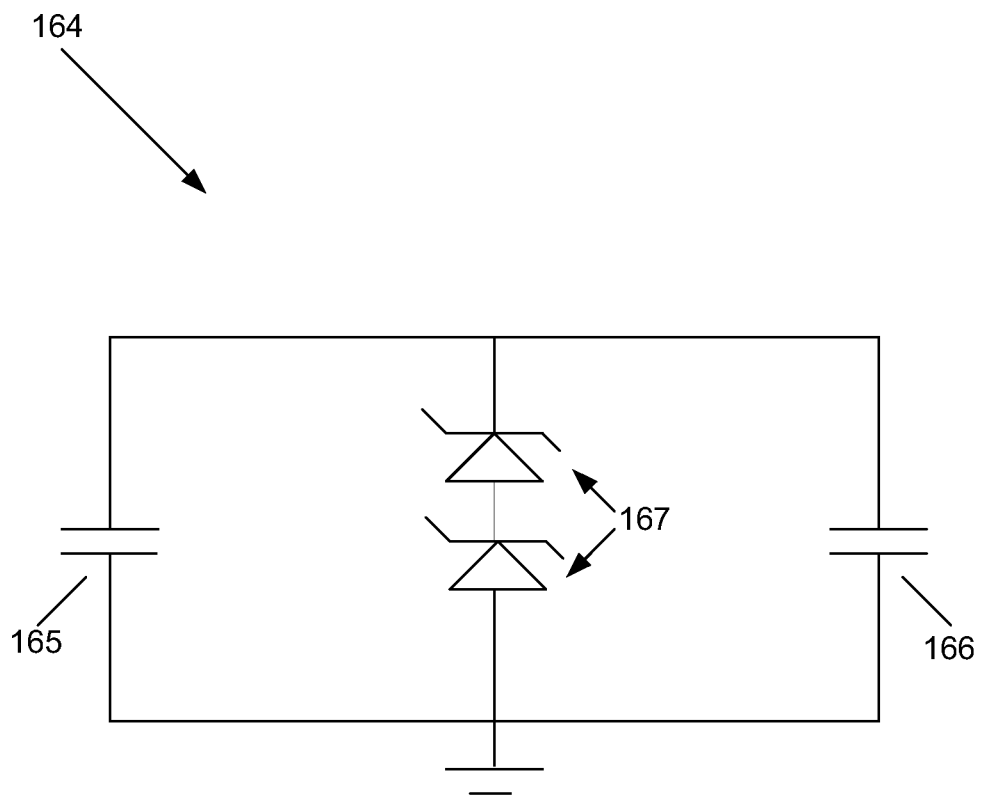
FIG. 2 shows a circuit diagram of a reference signal generator according to an embodiment of the invention.

As shown in the embodiment of FIG. 1, reference signal generator 164 may be within a connection box 170 that is between second coupling capacitor 130 and ground 150. Reference signal generator 164 may be an impedance circuit 164 that is electrically connected to second conductive rod 135 and is configured to generate the reference signal. As shown in FIG. 2, impedance circuit 164 includes a first capacitor 165, a second capacitor 166, and a plurality of zener diodes 167 electrically connected in parallel. Although only two zener diodes are shown in FIG. 2, it is understood that any number of zener diodes may be used in impedance circuit 164, as needed.

Figure 3:
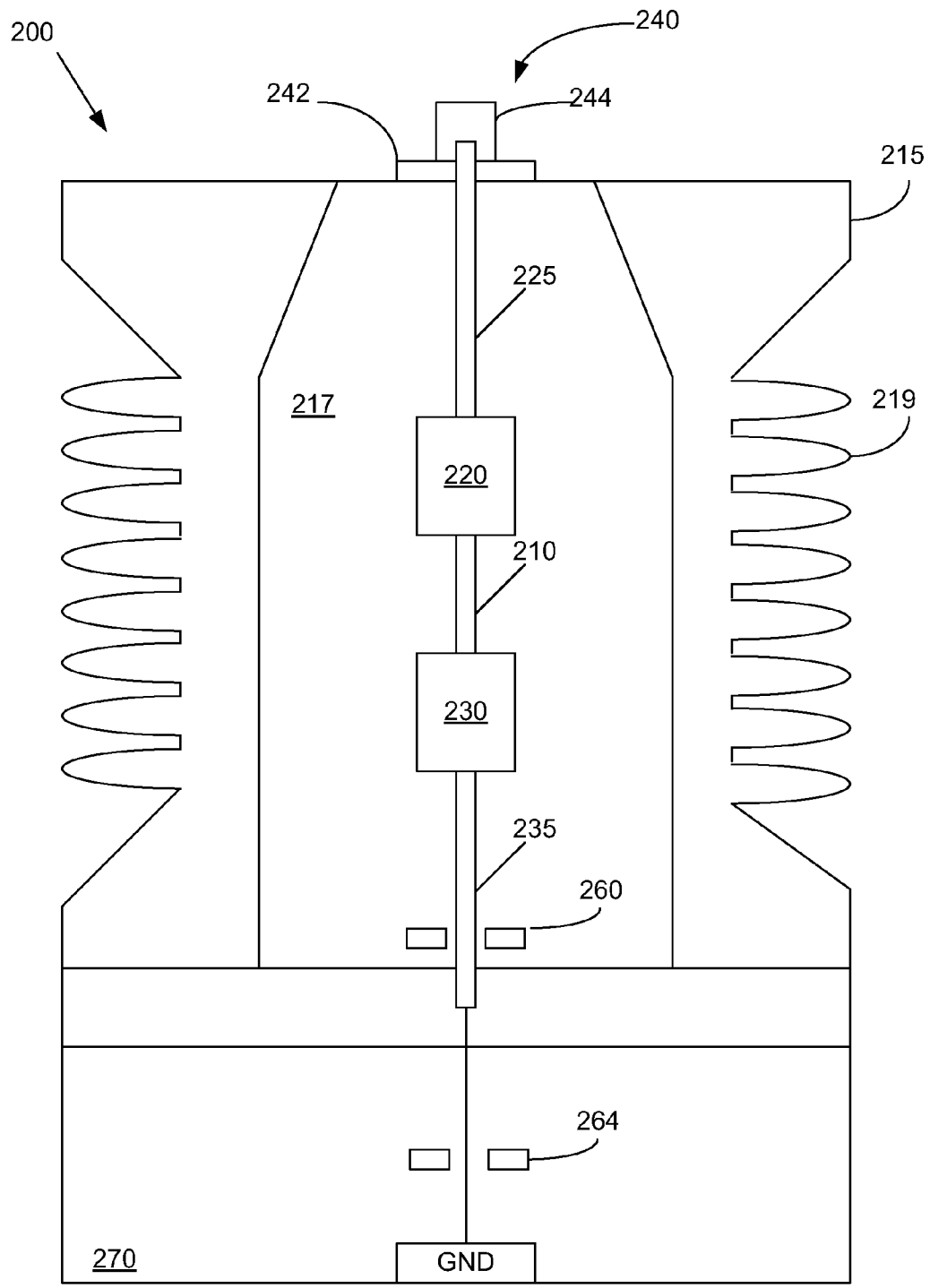
FIG. 3 shows a cross-sectional view of a PDA coupling device according to an embodiment of the invention.

Turning now to FIG. 3, a cross-sectional view of a partial discharge analysis (PDA) coupling device 200 according to another embodiment of the invention is shown. Similar to PDA coupling device 100 shown in FIG. 1, PDA coupling device 200 generally includes a casing 215 comprising a cavity 217. Cavity 217 includes an electrical potting material (not shown) that encapsulates a connector 210, a first coupling capacitor 220, a second coupling capacitor 230, a first conductive rod 225, and a second conductive rod 235. Connector 210 electrically connects first coupling capacitor 220 and second coupling capacitor 230 along a central axis within casing 215, so that a uniform electrical stress is provided. First coupling capacitor 220 is also electrically connected to a high voltage input end 240 of PDA coupling device 200 by first conductive rod 225. Second coupling capacitor 230 is electrically connected to ground 250 by second conductive rod 235. A current transformer 260 substantially surrounds a portion of second conductive rod 235 and is configured to generate a pulse signal (not shown).

Comparing PDA coupling device 200 in FIG. 3 and PDA coupling device 100 in FIG. 1, it can be seen that reference signal generator 264 within connection box 270 includes a second current transformer 264 substantially surrounding second conductive rod 235. Second current transformer 264 may be within connection box 270. Second current transformer 264 is configured to generate the reference signal (not shown).

Figure 4:
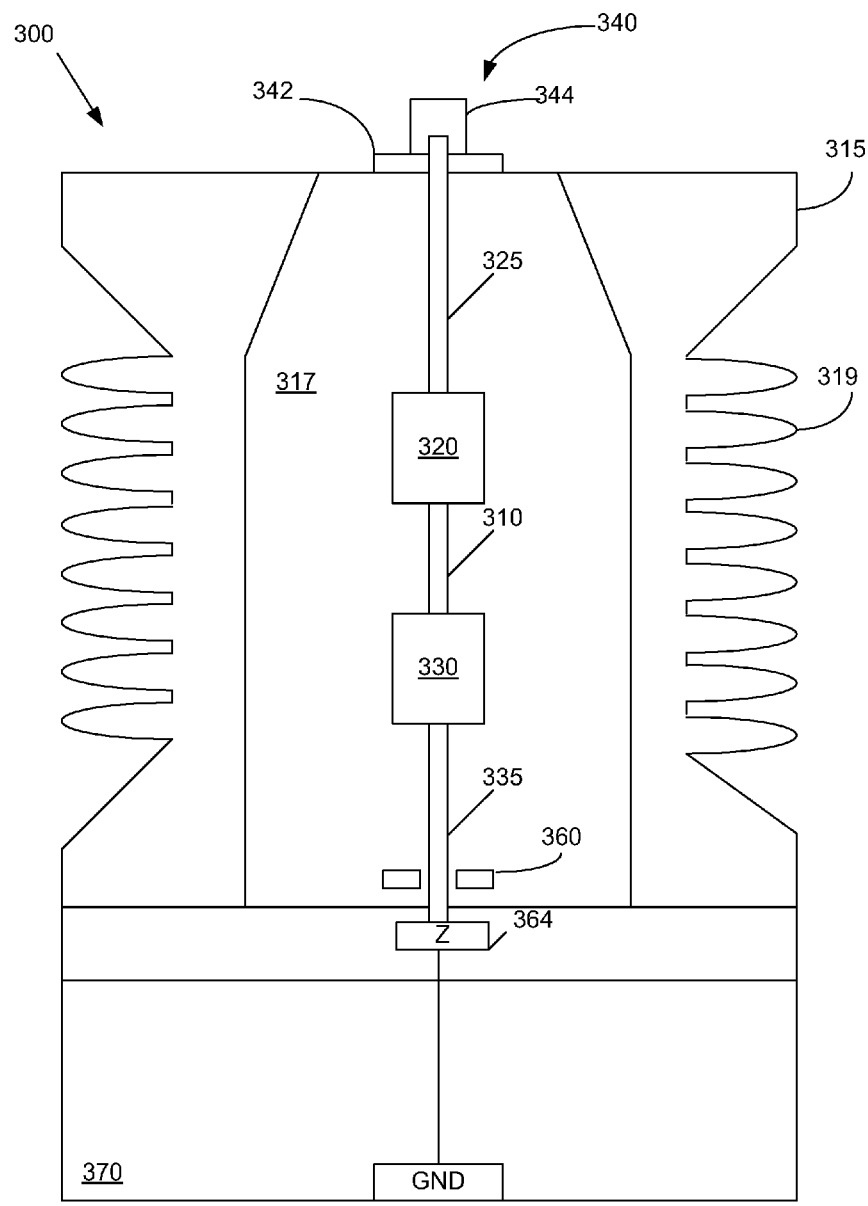
FIG. 4 shows a cross-sectional view of a PDA coupling device according to an embodiment of the invention.

Referring now to FIG. 4, a cross-sectional view of a partial discharge analysis (PDA) coupling device 300 according to another embodiment of the invention is shown. PDA coupling device 300 is similar to PDA coupling device 100 (FIG. 1) and PDA coupling device 200 (FIG. 3). However, it can be seen that reference signal generator 364 of PDA coupling device 300 is within casing 315 and not within connection box 370. Reference signal generator 364 is an impedance circuit 364 similar to impedance circuit 164 in FIG. 2. That is, impedance circuit 364 includes a first capacitor 165, a second capacitor 166, and a plurality of zener diodes 167 electrically connected in parallel. Moreover, impedance circuit 364 is electrically connected to second conductive rod 335.

Figure 5:
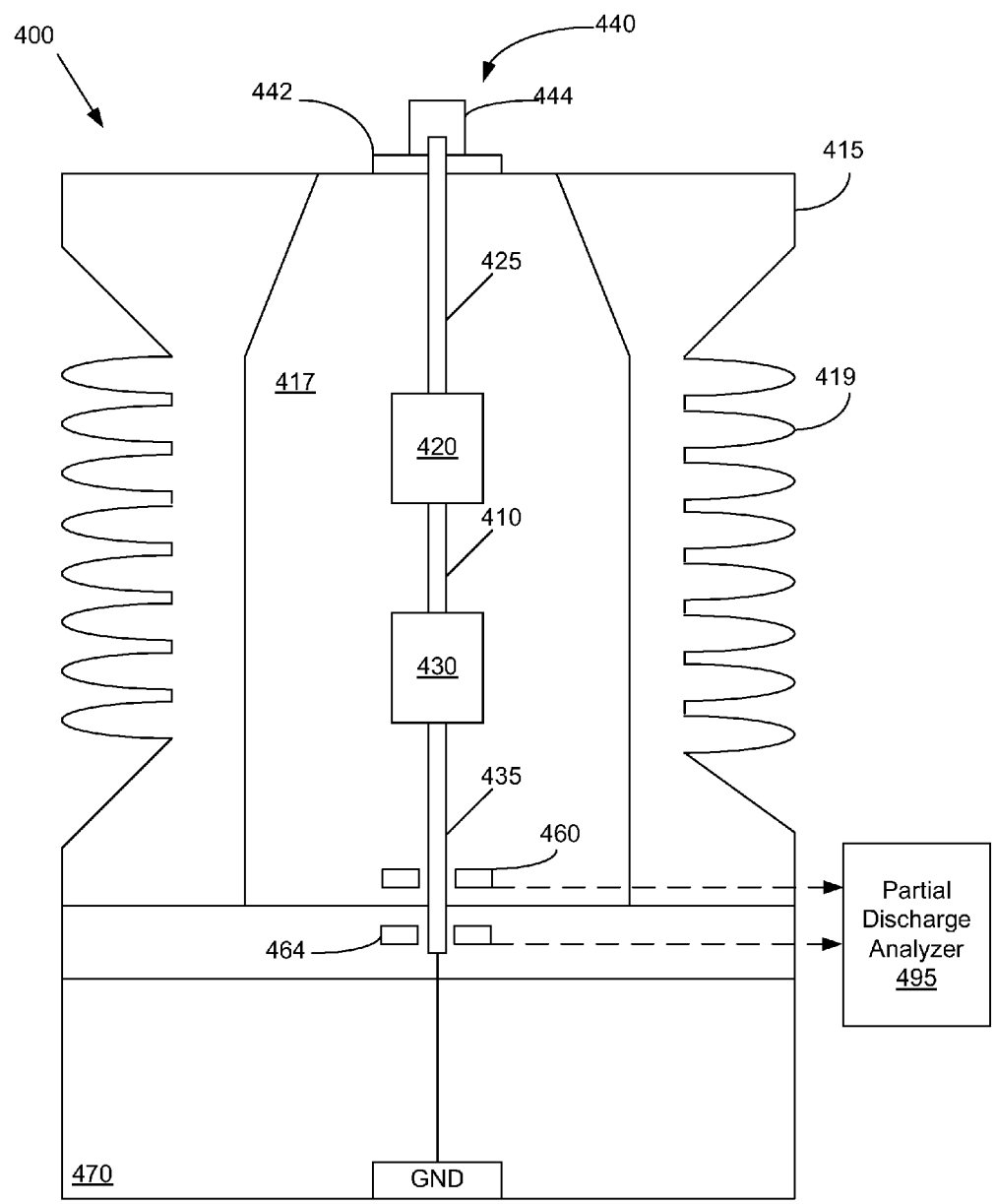
FIG. 5 shows a cross-sectional view of a PDA coupling device according to an embodiment of the invention.

Referring now to FIG. 5, a cross-sectional view of a partial discharge analysis (PDA) coupling device 400 according to another embodiment of the invention is shown. PDA coupling device 400 is similar to PDA coupling device 100 (FIG. 1), PDA coupling device 200 (FIG. 3), and PDA coupling device 300 (FIG. 4). However, it can be seen that reference signal generator 464 of PDA coupling device 400 is a second current transformer 464 located within casing 415 and not within connection box 470. As shown, second current transformer 464 substantially surrounds second conductive rod 435 and is configured to generate the reference signal (not shown).

As seen in FIG. 5, PDA coupling device 400 may further include a first probe for sending the pulse signal from current transformer 460 to a partial discharge analyzer 495. A second probe sends the reference signal from reference signal generator 464 to partial discharge analyzer 495. Although partial discharge analyzer 495 is only shown in FIG. 5 with PDA coupling device 400, it is understood that other embodiments of the invention, such as PDA coupling device 100 (FIG. 1), PDA coupling device 200 (FIG. 3), and PDA coupling device 300 (FIG. 4) may also include partial discharge analyzer 495.

Partial discharge analyzer 495 is any now known or later developed analyzer for analyzing, for example, the degradation of the insulation of generator stator windings. In the embodiments of the invention, as shown in FIGS. 1 and 3-5, since the pulse signal generated by current transformer 160, 260, 360, 460 and the reference signal generated by reference signal generator 164, 264, 364, 464 are generated from the same device, the pulse signal and the reference signal are "in phase". As known in the art, to be "in phase", two signals must go through the maximum and minimum points at the same time and in the same direction. Since the pulse signal and the reference signal are "in phase", partial discharge analyzer 495 may accurately determine from the pulse signal, for example, the degradation of the insulation of generator stator windings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A device comprising:
   a connector electrically connecting a first coupling capacitor and a second coupling capacitor;
   a first conductive rod for electrically connecting the first coupling capacitor to a high voltage input;
   a second conductive rod for electrically connecting the second coupling capacitor to ground;
   a current transformer substantially surrounding a portion of the second conductive rod, the current transformer configured to generate a pulse signal; and
   a reference signal generator adjacent to the current transformer configured to generate a reference signal in phase with the pulse signal and electrically coupled to the second conductive rod.

2. The device of claim 1, further comprising a connection box between the second coupling capacitor and ground, wherein the reference signal generator is within the connection box.

3. The device of claim 2, wherein the reference signal generator includes an impedance circuit electrically connected to the second conductive rod, and wherein the impedance circuit is configured to generate the reference signal.

4. The device of claim 3, wherein the impedance circuit includes a first capacitor, a second capacitor, and a plurality of zener diodes connected in parallel.

5. The device of claim 2, wherein the reference signal generator includes a second current transformer substantially surrounding the second conductive rod, and wherein the second current transformer is configured to generate the reference signal.

6. The device of claim 1, wherein the reference signal generator includes an impedance circuit below the second coupling capacitor, and wherein the impedance circuit is electrically connected to the second conductive rod.

7. The device of claim 1, wherein the reference signal generator includes a second current transformer substantially surrounding the second conductive rod, and wherein the second current transformer is configured to generate the reference signal.

8. The device of claim 1, further comprising a casing including a cavity, wherein the cavity includes at least the connector, the first and second coupling capacitors, the first and second conductive rods, and the current transformer.

9. The device of claim 1, wherein the high voltage input is an output of a generator.

10. The device of claim 1, wherein the pulse signal and the reference signal are in phase.

11. A partial discharge analysis (PDA) coupling device comprising:
    a connector electrically connecting a first coupling capacitor and a second coupling capacitor;
    a first conductive rod configured to electrically connect the first coupling capacitor to a high voltage output of a generator;
    a second conductive rod configured to electrically connect the second coupling capacitor to ground;
    a current transformer substantially surrounding a portion of the second conductive rod, the current transformer configured to generate a pulse signal;
    a reference signal generator adjacent to the current transformer configured to generate a reference signal in phase with the pulse signal and electrically coupled to the second conductive rod; and
    a casing comprising a cavity including electrical potting material, wherein the cavity includes at least the connector, the first and second coupling capacitors, the first and second conductive rods, and the current transformer.

12. The PDA coupling device of claim 11, further comprising a connection box between the second coupling capacitor and ground, wherein the reference signal generator is within the connection box.

13. The PDA coupling device of claim 12, wherein the reference signal generator includes an impedance circuit electrically connected to the second conductive rod, and wherein the impedance circuit is configured to generate the reference signal.

14. The PDA coupling device of claim 13, wherein the impedance circuit includes a first capacitor, a second capacitor, and a plurality of zener diodes connected in parallel.

15. The PDA coupling device of claim 12, wherein the reference signal generator includes a second current transformer substantially surrounding the second conductive rod, and wherein the second current transformer is configured to generate the reference signal.

16. The PDA coupling device of claim 11, wherein the reference signal generator is within the casing.

17. The PDA coupling device of claim 16, wherein the reference signal generator includes an impedance circuit electrically connected to the second conductive rod and ground.

18. The PDA coupling device of claim 11, wherein the reference signal generator includes a second current transformer substantially surrounding the second conductive rod, and wherein the second current transformer is configured to generate the reference signal.

19. The PDA coupling device of claim 11, wherein the reference signal and the pulse signal are in phase.

20. The PDA coupling device of claim 11, wherein the current transformer is configured to send the pulse signal to a partial discharge analyzer, and the reference signal generator is configured to send the reference signal to the partial discharge analyzer.

* * * * *